(12) United States Patent
Fitzgerald et al.

(10) Patent No.: US 7,259,108 B2
(45) Date of Patent: *Aug. 21, 2007

(54) METHODS FOR FABRICATING STRAINED LAYERS ON SEMICONDUCTOR SUBSTRATES

(75) Inventors: Eugene Fitzgerald, Windham, NH (US); Matthew Currie, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/362,892

(22) Filed: Feb. 27, 2006

(65) Prior Publication Data

US 2006/0148225 A1 Jul. 6, 2006

Related U.S. Application Data

(63) Continuation of application No. 10/389,003, filed on Mar. 14, 2003, now Pat. No. 7,060,632.

(60) Provisional application No. 60/364,733, filed on Mar. 14, 2002.

(51) Int. Cl.
*H01L 21/31* (2006.01)
(52) U.S. Cl. .................................... 438/767
(58) Field of Classification Search ............... 438/758, 438/763, 767; 117/89, 84, 103, 104; 257/18, 257/19, E29.193
See application file for complete search history.

(56) References Cited

U.S. PATENT DOCUMENTS

| 4,010,045 | A | 3/1977 | Ruehrwein |
| 4,710,788 | A | 12/1987 | Dambkes et al. |
| 4,990,979 | A | 2/1991 | Otto |
| 4,997,776 | A | 3/1991 | Harame et al. |
| 5,013,681 | A | 5/1991 | Godbey et al. |
| 5,155,571 | A | 10/1992 | Wang et al. |
| 5,166,084 | A | 11/1992 | Pfiester |
| 5,177,583 | A | 1/1993 | Endo et al. |
| 5,202,284 | A | 4/1993 | Kamins et al. |
| 5,207,864 | A | 5/1993 | Bhat et al. |
| 5,208,182 | A | 5/1993 | Narayan et al. |
| 5,212,110 | A | 5/1993 | Pfiester et al. |

(Continued)

FOREIGN PATENT DOCUMENTS

DE  41 01 167  7/1992

(Continued)

OTHER PUBLICATIONS

U.S. Appl. No. 60/299,986, filed on Jun. 21, 2001.*

(Continued)

*Primary Examiner*—Brook Kebede
(74) *Attorney, Agent, or Firm*—Goodwin Procter LLP

(57) ABSTRACT

Methods for fabricating multi-layer semiconductor structures including strained material layers using a minimum number of process tools and under conditions optimized for each layer. Certain regions of the strained material layers are kept free of impurities that can interdiffuse from adjacent portions of the semiconductor. When impurities are present in certain regions of the strained material layers, there is degradation in device performance. By employing semiconductor structures and devices (e.g., field effect transistors or "FETs") that have the features described, or are fabricated in accordance with the steps described, device operation is enhanced.

18 Claims, 3 Drawing Sheets

U.S. PATENT DOCUMENTS

| | | | |
|---|---|---|---|
| 5,221,413 A | 6/1993 | Brasen et al. | |
| 5,241,197 A | 8/1993 | Murakami et al. | |
| 5,250,445 A | 10/1993 | Bean et al. | |
| 5,285,086 A | 2/1994 | Fitzgerald, Jr. | |
| 5,291,439 A | 3/1994 | Kauffmann et al. | |
| 5,298,452 A | 3/1994 | Meyerson | |
| 5,310,451 A | 5/1994 | Tejwani et al. | |
| 5,316,958 A | 5/1994 | Meyerson | |
| 5,346,848 A | 9/1994 | Grupen-Shemansky et al. | |
| 5,374,564 A | 12/1994 | Bruel | |
| 5,399,522 A | 3/1995 | Ohori | |
| 5,413,679 A | 5/1995 | Godbey | |
| 5,426,069 A | 6/1995 | Selvakumar et al. | |
| 5,426,316 A | 6/1995 | Mohammad | |
| 5,442,205 A | 8/1995 | Brasen et al. | |
| 5,461,243 A | 10/1995 | Ek et al. | |
| 5,461,250 A | 10/1995 | Burghartz et al. | |
| 5,462,883 A | 10/1995 | Dennard et al. | |
| 5,476,813 A | 12/1995 | Naruse | |
| 5,479,033 A | 12/1995 | Baca et al. | |
| 5,484,664 A | 1/1996 | Kitahara et al. | |
| 5,523,243 A | 6/1996 | Mohammad | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,540,785 A | 7/1996 | Dennard et al. | |
| 5,596,527 A | 1/1997 | Tomioka et al. | |
| 5,617,351 A | 4/1997 | Bertin et al. | |
| 5,630,905 A | 5/1997 | Lynch et al. | |
| 5,659,187 A | 8/1997 | Legoues et al. | |
| 5,683,934 A | 11/1997 | Candelaria | |
| 5,698,869 A | 12/1997 | Yoshimi et al. | |
| 5,714,777 A | 2/1998 | Ismail et al. | |
| 5,728,623 A | 3/1998 | Mori | |
| 5,739,567 A | 4/1998 | Wong | |
| 5,759,898 A | 6/1998 | Ek et al. | |
| 5,777,347 A | 7/1998 | Bartelink | |
| 5,786,612 A | 7/1998 | Otani et al. | |
| 5,786,614 A | 7/1998 | Chuang et al. | |
| 5,792,679 A | 8/1998 | Nakato | |
| 5,808,344 A | 9/1998 | Ismail et al. | |
| 5,847,419 A | 12/1998 | Imai et al. | |
| 5,877,070 A | 3/1999 | Goesele et al. | |
| 5,891,769 A | 4/1999 | Liaw et al. | |
| 5,906,708 A | 5/1999 | Robinson et al. | |
| 5,906,951 A | 5/1999 | Chu et al. | |
| 5,912,479 A | 6/1999 | Mori et al. | |
| 5,943,560 A | 8/1999 | Chang et al. | |
| 5,963,817 A | 10/1999 | Chu et al. | |
| 5,966,622 A | 10/1999 | Levine et al. | |
| 5,998,807 A | 12/1999 | Lustig et al. | |
| 6,013,134 A | 1/2000 | Chu et al. | |
| 6,033,974 A | 3/2000 | Henley et al. | |
| 6,033,995 A | 3/2000 | Muller | |
| 6,058,044 A | 5/2000 | Sugiura et al. | |
| 6,059,895 A | 5/2000 | Chu et al. | |
| 6,074,919 A | 6/2000 | Gardner et al. | |
| 6,096,590 A | 8/2000 | Chan et al. | |
| 6,103,559 A | 8/2000 | Gardner et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,133,799 A | 10/2000 | Favors, Jr. et al. | |
| 6,140,687 A | 10/2000 | Shimomura et al. | |
| 6,143,636 A | 11/2000 | Forbes et al. | |
| 6,153,495 A | 11/2000 | Kub et al. | |
| 6,154,475 A | 11/2000 | Soref et al. | |
| 6,160,303 A | 12/2000 | Fattaruso | |
| 6,162,688 A | 12/2000 | Gardner et al. | |
| 6,184,111 B1 | 2/2001 | Henley et al. | |
| 6,191,007 B1 | 2/2001 | Matsui et al. | |
| 6,191,432 B1 | 2/2001 | Sugiyama et al. | |
| 6,194,722 B1 | 2/2001 | Fiorini et al. | |
| 6,204,529 B1 | 3/2001 | Lung et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,232,138 B1 | 5/2001 | Fitzgerald et al. | |
| 6,235,567 B1 | 5/2001 | Huang | |
| 6,242,324 B1 | 6/2001 | Kub et al. | |
| 6,249,022 B1 | 6/2001 | Lin et al. | |
| 6,251,755 B1 | 6/2001 | Furukawa et al. | |
| 6,261,929 B1 | 7/2001 | Gehrke et al. | |
| 6,266,278 B1 | 7/2001 | Harari et al. | |
| 6,271,551 B1 | 8/2001 | Schmitz et al. | |
| 6,271,726 B1 | 8/2001 | Fransis et al. | |
| 6,291,321 B1 | 9/2001 | Fitzgerald | |
| 6,313,016 B1 | 11/2001 | Kibbel et al. | |
| 6,316,301 B1 | 11/2001 | Kant | |
| 6,323,108 B1 | 11/2001 | Kub et al. | |
| 6,329,063 B2 | 12/2001 | Lo et al. | |
| 6,335,546 B1 | 1/2002 | Tsuda et al. | |
| 6,339,232 B1 | 1/2002 | Takagi | |
| 6,350,993 B1 | 2/2002 | Chu et al. | |
| 6,368,733 B1 | 4/2002 | Nishinaga | |
| 6,372,356 B1 | 4/2002 | Thornton et al. | |
| 6,399,970 B2 | 6/2002 | Kubo et al. | |
| 6,403,975 B1 | 6/2002 | Brunner et al. | |
| 6,407,406 B1 | 6/2002 | Tezuka | |
| 6,425,951 B1 | 7/2002 | Chu et al. | |
| 6,429,061 B1 | 8/2002 | Rim | |
| 6,521,041 B2 | 2/2003 | Wu et al. | |
| 6,555,839 B2 | 4/2003 | Fitzgerald | |
| 6,559,021 B2 | 5/2003 | Houghton et al. | |
| 6,770,134 B2 | 8/2004 | Maydan et al. | |
| 7,060,632 B2 * | 6/2006 | Fitzgerald et al. | 438/767 |
| 2001/0003269 A1 | 6/2001 | Wu et al. | |
| 2001/0003364 A1 | 6/2001 | Sugawara et al. | |
| 2002/0024395 A1 | 2/2002 | Akatsuka et al. | |
| 2002/0043660 A1 | 4/2002 | Yamazaki et al. | |
| 2002/0068393 A1 | 6/2002 | Fitzgerald et al. | |
| 2002/0072130 A1 | 6/2002 | Cheng et al. | |
| 2002/0096717 A1 | 7/2002 | Chu et al. | |
| 2002/0100942 A1 | 8/2002 | Fitzgerald et al. | |
| 2002/0123167 A1 | 9/2002 | Fitzgerald | |
| 2002/0123183 A1 | 9/2002 | Fitzgerald | |
| 2002/0123197 A1 | 9/2002 | Fitzgerald et al. | |
| 2002/0125471 A1 | 9/2002 | Fitzgerald et al. | |
| 2002/0125497 A1 | 9/2002 | Fitzgerald | |
| 2002/0140031 A1 | 10/2002 | Rim | |
| 2002/0168864 A1 | 11/2002 | Cheng et al. | |
| 2002/0197803 A1 * | 12/2002 | Leitz et al. | 438/285 |
| 2003/0003679 A1 | 1/2003 | Doyle et al. | |
| 2003/0013323 A1 | 1/2003 | Hammond et al. | |
| 2003/0025131 A1 | 2/2003 | Lee et al. | |
| 2003/0057439 A1 | 3/2003 | Fitzgerald | |
| 2003/0139000 A1 | 7/2003 | Bedell et al. | |

FOREIGN PATENT DOCUMENTS

| | | |
|---|---|---|
| EP | 0 514 018 | 11/1992 |
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| FR | 2 701 599 | 9/1993 |
| GB | 2 342 777 | 4/2000 |
| JP | 4-307974 | 10/1992 |
| JP | 04-307974 | 10/1992 |
| JP | 5-166724 | 7/1993 |

| | | |
|---|---|---|
| JP | 6-177046 | 6/1994 |
| JP | 6-244112 | 9/1994 |
| JP | 6-252046 | 9/1994 |
| JP | 07-094420 | 4/1995 |
| JP | 7-094420 | 4/1995 |
| JP | 07-106446 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-031491 | 1/2000 |
| JP | 2000-021783 | 8/2000 |
| JP | 2001-319935 | 11/2001 |
| JP | 2002-076334 | 3/2002 |
| JP | 2002-164520 | 6/2002 |
| JP | 2002-289533 | 10/2002 |
| WO | 98/59365 | 12/1998 |
| WO | 99/53539 | 10/1999 |
| WO | 00/48239 | 8/2000 |
| WO | 00/54338 | 9/2000 |
| WO | 01/22482 | 3/2001 |
| WO | 01/22482 A1 | 3/2001 |
| WO | 01/54202 | 7/2001 |
| WO | 01/93338 | 12/2001 |
| WO | 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |

OTHER PUBLICATIONS

U.S. Appl. No. 60/310,346, filed on Aug. 6, 2006.*
"2 Bit/Cell EEPROM Cell Using Band to Band Tunneling for Data Read-Out," IBM Technical Disclosure Bulletin, vol. 35, No. 4B (Sep. 1992) pp. 136-140.
Armstrong et al., "Design of Si/SiGe Heterojunction Complementary Metal-Oxide-Semiconductor Transistors," *IEDM Technical Digest* (1995) pp. 761-764.
Armstrong, "Technology for SiGe Heterostructure-Based CMOS Devices", Ph.D Thesis, Massachusetts Institute of Technology (1999) pp. 1-154.
Augusto et al., "Proposal for a New Process Flow for the Fabrication of Silicon-Based Complementary MOD-MODSETs without Ion Implantation," *Thin Solid Films*, vol. 294, No. 1-2 (1997) pp. 254-258.
Barradas et al., "RBS analysis of MBE-grown SiGe/(001) Si heterostructures with thin, high Ge content SiGe channels for HMOS transistors," *Modern Physics Letters B* (2001) (abstract).
Batterman, "Hillocks, Pits, and Etch Rate in Germanium Crystals," *Journal of Applied Physics*, vol. 28, No. 11 (Nov. 1957), pp. 1236-1241.
Bohg, "Ethylene Diamine-Pyrocatechol-Water Shows Etching Anomaly in Boron-Doped Silicon," *Journal of the Electrochemical Society*, vol. 118, No. 2 (Feb. 1971), pp. 401-402.
Borenstein et al., "A New Ultra-Hard Etch-Stop Layer for High Precision Micromachining," *Proceedings of the 1999 12th IEEE International Conference on Micro Electro Mechanical Systems (MEMs)* (Jan. 17-21, 1999) pp. 205-210.
Bouillon et al., "Search for the optimal channel architecture for 0.18/0.12 μm bulk CMOS Experimental study," *IEEE* (1996) pp. 21.2.1-21.2.4.
Bruel et al., "® Smart Cut: A Promising New SOI Material Technology," Proceedings 1995 IEEE International SOI Conference (Oct. 1995) pp. 178-179.
Bruel, "Silicon on Insulator Material Technology," Electronic Letters, vol. 13, No. 14 (Jul. 6, 1995) pp. 1201-1202.
Brunner et al., "Molecular beam epitaxy growth and thermal stability of $Si_{1-x}Ge_x$ layers on extremely thin silicon-on-insulator substrates," *Thin Solid Films*, vol. 321 (1998), pp. 245-250.
Bufler et al., "Hole transport in strained $Si_{1-x}Ge_x$ alloys on $Si1-yGey$ substrates," *Journal of Applied Physics*, vol. 84, No. 10 (Nov. 15, 1998) pp. 5597-5602.
Burghartz et al., "Microwave Inductors and Capacitors in Standard Multilevel Interconnect Silicon Technology", *IEEE Transactions on Microwave Theory and Techniques*, vol. 44, No. 1 (Jan. 1996) pp. 100-104.
Canaperi et al., "Preparation of a relaxed Si-Ge layer on an insulator in fabricating high-speed semiconductor devices with strained epitaxial films," International Business Machines Corporation, USA (2002) (abstract).
Carlin et al., "High Efficiency GaAs-on-Si Solar Cells with High Voc Using Graded GeSi Buffers," *IEEE* (2000) pp. 1006-1011.
Chang et al., "Selective Etching of SiGe/Si Heterostructures," *Journal of the Electrochemical Society*, No. 1 (Jan. 1991) pp. 202-204.
Chen et al., "The Band Model and the Etching Mechanism of Silicon in Aqueous KOH," *Journal of the Electrochemical Society*, vol. 142, No. 1 (Jan. 1995), pp. 170-176.
Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001) pp. 321-323.
Cheng et al., "Relaxed Silicon-Germanium on Insulator Substrate by Layer Transfer," *Journal of Electronic Materials*, vol. 30, No. 12 (2001) pp. L37-L39.
Cullis et al., "Growth ripples upon strained SiGe epitaxial layers on Si and misfit dislocation interactions," *Journal of Vacuum Science and Technology A*, vol. 12, No. 4 (Jul./Aug. 1994) pp. 1924-1931.
Currie et al., "Carrier mobilities and process stability of strained Si n- and p-MOSFETs on SiGe virtual substrates," *J. Vac. Sci. Technol. B.*, vol. 19, No. 6 (Nov./Dec. 2001) pp. 2268-2279.
Currie et al., "Controlling Threading Dislocation in Ge on Si Using Graded SiGe Layers and Chemical-Mechanical Polishing," vol. 72 No. 14 (Apr. 6, 1998) pp. 1718-1720.
Desmond et al., "The Effects of Process-Induced Defects on the Chemical Selectivity of Highly Doped Boron Etch Stops in Silicon," *Journal of the Electrochemical Society*, vol. 141, No. 1 (Jan. 1994), pp. 178-184.
Eaglesham et al., "Dislocation-Free Stranski-Krastanow of Ge on Si(100)," *Physical Review Letters*, vol. 64, No. 16 (Apr. 16, 1990) pp. 1943-1946.
Ehman et al., "Morphology of Etch Pits on Germanium Studied by Optical and Scanning Electron Microscopy," *Journal of Applied Physics*, vol. 41, No. 7 (Jun. 1970), pp. 2824-2827.
Examination Report for European Patent Application No. 01 973 651.1-1528, dated Mar. 22, 2004, 3 pages.
Examination Report for European Patent Application No. 01 973 651.1-1528, dated Nov. 12, 2004, 9 pages.
Examination Report for European Patent Application No. 01 989 893.1-1235, dated Aug. 16, 2004, 5 pages.
Examination Report for European Patent Application No. 02 709 406.9-2203, dated May 11, 2004, 3 pages.
Examination Report for European Patent Application No. 02 709 406.9-2203, dated Mar. 24, 2005, 5 pages.
Examination Report for European Patent Application No. 98 931 529.6-2203, dated Jan. 10, 2002, 4 pages.
Examination Report for European Patent Application No. 98 931 529.6-2203, dated May 9, 2003, 5 pages.
Examination Report for European Patent Application No. 01 973 651.1-1528, dated Sep. 7, 2005, 4 pages.
Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994) pp. 493-496.
Feijóo et al., "Etch Stop Barriers in Silicon Produced by Ion Implantation of Electrically Non-Active Species," *Journal of the Electrochemical Society*, vol. 139, No. 8 (Aug. 1992), pp. 2309-2313.

Finne et al., "A Water-Amine-Complexing Agent System for Etching Silicon," *Journal of the Electrochemical Society*, vol. 114, No. 9 (Sep. 1967), pp. 965-970.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234-2252.

Fischetti, "Long-range Coulomb interactions in small Si devices. Part II. Effective electron mobility in thin-oxide structures," *Journal of Applied Physics*, vol. 89, No. 2 (Jan. 15, 2001) pp. 1232-1250.

Fitzgerald et al., "Dislocation dynamics in relaxed graded composition semiconductors," *Materials Science and Engineering B67* (1999) pp. 53-61.

Fitzgerald et al., "Dislocations in Relaxed SiGe/Si Heterostructures," *Physica Status Solidi A*, Applied Research, Berlin, DE, vol. 171, Nr. 1, p. 227-238, Jan. 16, 1999.

Fitzgerald et al., "Relaxed $Ge_xSi_{1-x}$ structures for III-V integration with Si and high mobility two-dimensional electron gases in Si," AT&T Bell Laboratories, Murray Hill, NJ 07974 (1992) *American Vacuum Society*, pp. 1807-1819.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991) pp. 811-813.

Fitzgerald, "GeSi/Si Nanostructures," *Annual Review of Materials Science*, vol. 25, (1995), pp. 417-454.

Frank, "Orientation-Dependent Dissolution of Germanium," *Journal of Applied Physics*, vol. 31, No. 11 (Nov. 1960), pp. 1996-1999.

Fukatsu, "SiGe-based semiconductor-on-insulator substrate created by low-energy separation-by-implanted-oxygen," *Applied Physics Letters*, vol. 72, No. 26 (Jun. 29, 1998), pp. 3485-3487.

Gannavaram, et al., "Low Temperature ($\leq 800°$ C) Recessed Junction Selective Silicon-Germanium Source/Drain Technology for sub-70 nm CMOS," *IEEE International Electron Device Meeting Technical Digest*, (2000), pp. 437-440.

Garone et al., "Silicon vapor phase epitaxial growth catalysis by the presence of germane," *Applied Physics Letters*, vol. 56, No. 13 (Mar. 26, 1990) pp. 1275-1277.

Ge et al., "Process-Strained Si (PSS) CMOS Technology Featuring 3D Strain Engineering," *IEEE International Electron Devices Meeting Technical Digest*, (2003) pp. 73-76.

Ghandi et al., "Chemical Etching of Germanium," *Journal of the Electrochemical Society*, vol. 135, No. 8 (Aug. 1988), pp. 2053-2054.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.

Godbey et al., (1990) "Fabrication of Bond and Etch-Back Silicon Insulator Using a Strained $SI^{0.7} GE_{0.3}$ Layer as an Etch Stop," *Journal of Electrical Society*, vol. 137, No. 10 (Oct. 1990) pp. 3219-3223.

Godbey et al., "A $Si_{0.7}Ge_{0.3}$ strained-layer etch stop for the generation of thin layer undoped silicon," *Applied Physics Letters*, vol. 56, No. 4 (Jan. 22, 1990), pp. 373-375.

Gray and Meyer, "Phase-Locked Loops", *Analysis and Design of Analog Integrated Circuits* (1984) pp. 605-632.

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531-2533.

Hackbarth et al., "Alternatives to thick MBE-grown relaxed SiGe buffers," *Thin Solid Films*, vol. 369, No. 1-2 (Jul. 2000) pp. 148-151.

Hackbarth et al., "Strain relieved SiGe buffers for Si-based heterostructure field-effect transistors," *Journal of Crystal Growth*, vol. 201/202 (1999) pp. 734-738.

Halsall et al., "Electron diffraction and Raman studies of the effect of substrate misorientation on ordering in the AlGaInP system," *Journal of Applied Physics*, vol. 85, No. 1 (1999), pp. 199-202.

Hamada et al., "A New Aspect of Mechanical Stress Effects in Scaled MOS Devices," *IEEE Transactions on Electron Devices*, vol. 38, No. 4 (Apr. 1991), pp. 895-900.

Herzog et al., "SiGe-based FETs: buffer issued and device results," *Thin Solid Films*, vol. 380 (2000) pp. 36-41.

Herzog et al., "X-Ray Investigation of Boron- and Germanium-Doped Silicon Epitaxial Layers," *Journal of the Electrochemical Society*, vol. 131, No. 12 (Dec. 1984), pp. 2969-2974.

Höck et al., "Carrier mobilities in modulation doped $Si_{1-x}Ge_x$ heterostructures with respect to FET applications," *Thin Solid Films*, vol. 336 (1998) pp. 141-144.

Höck et al., "High hole mobility in $Si_{0.17} Ge_{0.83}$ channel metal-oxide-semiconductor field-effect transistors grown by plasma-enhanced chemical vapor deposition," *Applied Physics Letters*, vol. 76, No. 26 (Jun. 26, 2000) pp. 3920-3922.

Höck et al., "High performance 0.25 μm p-type Ge/SiGe MODFETs," *Electronics Letters*, vol. 34, No. 19 (Sep. 17, 1998) pp. 1888-1889.

Holmes, "The Orientation Dependence of Etching Effects on Germanium Crystals," *Acta Metallurgica*, vol. 7, No. 4 (Apr. 1959), pp. 283-290.

Hsu et al., "Surface morphology of related $Ge_xSi_{1-x}$ films," *Appl. Phys. Lett.*, vol. 61, No. 11 (1992), pp. 1293-1295.

Huang et al., (2001) "Carrier Mobility enhancement in strained Si-on-insulatoir fabricated by wafer bonding", *2001 Symposium on VLSI Technology, Digest of Technical Papers*, pp. 57-58.

Huang et al., "High-quality strain-relaxed SiGe alloy grown on implanted silicon-on-insulator substrate," *Applied Phyusics Letters*, vol. 76, No. 19 (May 8, 200) pp. 2680-2682.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang et al., "The Impact of Scaling Down to Deep Submicron on CMOS RF Circuits", *IEEE Journal of Solid-State Circuits*, vol. 33, No. 7, Jul. 1998, pp. 1023-1036.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Hunt et al., "Highly Selective Etch Stop by Stress Compensation for Thin-Film BESOI," *1990 IEEE/SOI Technology Conference*, (Oct. 2-4, 1990), pp. 145-146.

IBM Technical Disclosure Bulletin, vol. 32, No. 8A, Jan. 1990, "Optimal Growth Technique and Structure for Strain Relaxation of Si-Ge Layers on Si Substrates", pp. 330-331.

Iida et al., "Thermal behavior of residual strain in silicon-on-insulator bonded wafer and effects on electron mobility," *Solid-State Electronics*, vol. 43 (1999), pp. 1117-1120.

International Search Report for Patent Application No. PCT/US 98/13076, dated Oct. 27, 1998, 2 pages.

International Search Report for Related International Application No. PCT/US/18007, Jan. 5, 2004.

Ishikawa et al., "Creation of Si-Ge based SIMOX structures by low energy oxygen implantation," *Proceedings 1997 IEEE International SOI Conference* (Oct. 1997) pp. 16-17.

Ishikawa et al., "SiGe-on-insulator substrate using SiGe alloy grown Si(001)," *Applied Physics Letters*, vol. 75, No. 7 (Aug. 16, 1999) pp. 983-985.

Ismail et al., "Modulation-doped n-type Si/SiGe with inverted interface," *Appl. Phys. Lett.*, vol. 65, No. 10 (Sep. 5, 1994) pp. 1248-1250.

Ismail, "Si/SiGe High-Speed Field-Effect Transistors," *Electron Devices Meeting*, Washington, D.C. (Dec. 10, 1995) pp. 20.1.1-20.1.4.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Jaccodine, "Use of Modified Free Energy Theorems to Predict Equilibrium Growing and Etching Shapes," *Journal of Applied Physics*, vol. 33, No. 8 (Aug. 1962), pp. 2643-2647.

Kearney et al., "The effect of alloy scattering on the mobility of holes in a $Si_{1-x}Ge_x$ quantum well," Semicond. Sci Technol., vol. 13 (1998) pp. 174-180.

Kern, "Chemical Etching of Silicon, Germanium, Gallium, Arsenide, and Gallium Phosphide," RCA Review, vol. 39 (Jun. 1978), pp. 278-308.

Kim et al., "A Fully Integrated 1.9-GHz CMOS Low-Noise Amplifier," IEEE Microwave and Guided Wave Letters, vol. 8, No. 8 (Aug. 1998) pp. 293-295.

Klauk et al., "Thermal stability of undoped strained Si channel SiGe heterostructures," Applied Physics Letter, No. 68, Apr. 1, 1996, pp. 1975-1977.

Koester et al., "Extremely High Transconductance $Ge/Si_{0.4}Ge_{0.6}$ p-MODFET's Grown by UHV-CVD," IEEE Electron Device Letters, vol. 21, No. 3 (Mar. 2000) pp. 110-112.

König et al., "Design Rules for n-Type SiGe Hetero FETs," Solid State Electronics, vol. 41, No. 10 (1997), pp. 1541-1547.

König et al., "p-Type Ge-Channel MODFET's with High Transconductance Grown on Si Substrates," IEEE Electron Device Letters, vol. 14, No. 4 (Apr. 1993) pp. 205-207.

König et al., "SiGe HBTs and HFETs," Solid-State Electronics, vol. 38, No. 9 (1995) pp. 1595-1602.

Kummer et al., "Low energy plasma enhanced chemical vapor deposition," Materials Science and Engineering B89 (2002) pp. 288-295.

Kuznetsov et al., "Technology for high-performance n-channel SiGe modulation-doped field-effect transistors," J. Vac. Sci. Technol., B 13(6) (Nov./Dec. 1995) pp. 2892-2896.

Lang et al., "Bulk Micromachining of Ge for IR Gratings," Journal of Micromechanics and Microengineering, vol. 6, No. 1 (Mar. 1996), pp. 46-48.

Langdo et al., (2002) "Preparation of Novel SiGe-free Strained Si on Insulator Substrates" IEEE International SOI Conference, pp. 211-212 (XP002263057).

Larson, "Integrated Circuit Technology Options for RFIC's—Present Status and Future Directions", IEEE Journal of Solid-State Circuits, vol. 33, No. 3, Mar. 1998, pp. 387-399.

Leancu et al., "Anisotropic Etching of Germanium," Sensors and Actuators, A46-47 (1995), pp. 35-37.

Lee et al., "CMOS RF Integrated Circuits at 5 GHz and Beyond", Proceedings of the IEEE, vol. 88, No. 10 (Oct. 2000) pp. 1560-1571.

Lee et al., "Strained Ge channel p-type metal-oxide-semiconductor field-effect transistors grown on $Si_{1-x}Ge_x/Si$ virtual substrates," Applied Physics Letters, vol. 79, No. 20 (Nov. 12, 2001) pp. 3344-3346.

Lee et al., "Strained Ge channel p-type MOSFETs fabricated on $Si_{1-x}Ge_x/Si$ virtual substrates," Mat. Res. Soc. Symp. Proc., vol. 686 (2002) pp. A1.9.1-A1.9.5.

LeGoues et al., "Relaxation of SiGe thin films grown on $Si/SiO_2$ substrates," Applied Physics Letters, vol. 75, No. 11 (Jun. 1, 1994), pp. 7240-7246.

Lehmann et al., "Implanted Carbon: An Effective Etch-Stop in Silicon," Journal of the Electrochemical Society, vol. 138, No. 5 (May 1991), pp. 3-4.

Leitz et al., "Channel Engineering of SiGe-Based Heterostructures for High Mobility MOSFETs," Mat. Res. Soc. Symp. Proc., vol. 686 (2002) pp. A3.10.1-A3.10.6.

Leitz et al., "Dislocation glide and blocking kinetics in compositionally graded SiGe/Si," Journal of Applied Physics, vol. 90, No. 6 (Sep. 15, 2001) pp. 2730-2736.

Leitz et al., "Hole mobility enhancements in strained Si/Sil-yGey p-type metal-oxide-semiconductor field-effect transistors grown on relaxed $Si_{1-x}Ge_x$ (x<y) virtual substrates," Applied Physics Letters, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," J. Vac. Sci. Technol., vol. 20 No. 3 (May/Jun. 2002) pp. 1030-1033.

Lochtefeld et al., "Investigating the Relationship Between Electron Mobility and Velocity in Deeply Scaled NMOS via Mechanical Stress," IEEE Electron Device Letters, vol. 22, No. 12 (2001) pp. 591-593.

Lu et al., "High Performance 0.1 μm Gate-Length P-Type SiGe MODFET's and MOS-MODFET's", IEEE Transactions on Electron Devices, vol. 47, No. 8 (Aug. 2000) pp. 1645-1652.

Maiti et al., "Strained-Si heterostructure field effect transistors," Semicond. Sci. Technol., vol. 13 (1998) pp. 1225-1246.

Maszara, "Silicon-On-Insulator by Wafer Bonding: A Review," Journal of the Electrochemical Society, No. 1 (Jan. 1991) pp. 341-347.

Meyerson et al., "Cooperative Growth Phenomena in Silicon/ Germanium Low-Temperature Epitaxy," Applied Physics Letters, vol. 53, No. 25 (Dec. 19, 1988) pp. 2555-2557.

Mizuno et al., Advanced SOI-MOSFETs with Strained-Si Channel for High Speed CMOS-Electron/Hole Mobility Enhancement, 2000 Symposium on VLSI Technology, Digest of Technical Papers, Honolulu, (Jun. 13-15), IEEE New York, NY, pp. 210-211.

Mizuno et al., "Electron and Hold Mobility Enhancement in Strained-Si MOSFET's on SiGe-on-Insulator Substrates Fabricated by SIMOX Technology," IEEE Electron Device Letters, vol. 21, No. 5 (May 2000) pp. 230-232.

Mizuno et al., "High Performance Strained-Si p-MOSFETs on SiGe-on-Insulator Substrates Fabricated by SIMOX Technology," IEEE IDEM Technical Digest (1999) pp. 934-936.

Narozny et al., "Si/SiGe Heterojunction Bipolar Transistor with Graded GAP SiGe Base Made by Molecular Beam Epitaxy," IEEE IEDM (1988), pp. 562-565.

Nayak et al., "High-Mobility Strained-Si PMOSFET's"; IEEE Transactions on Electron Devices, vol. 43, No. 10 (Oct. 1996) pp. 1709-1716.

Notice of Final Rejection for Korean Patent Application No. 10-1999-7012279, dated Feb. 25, 2003 2 pages (English translation attached).

Notice of Preliminary Rejection for Korean Patent Application No. 10-1999-7012279, dated Feb. 21, 2002, 2 pages (English translation attached).

O'Neill et al., "SiGe Virtual substrate N-channel heterojunction MOSFETS," Semicond. Sci. Technol., vol. 14 (1999) pp. 784-789.

Ootsuka et al., "A Highly Dense, High-Performance 130nm node CMOS Technology for Large Scale System-on-a-Chip Applications," IEEE International Electron Devices Meeting Technical Digest, (2000), pp. 575-578.

Ota et al., "Novel Locally Strained Channel Technique for High Performance 55nm CMOS," IEEE International Electron Devices Meeting Technical Digest, (2002), pp. 27-30.

Ota, Y. et al., "Application of heterojunction FET to power amplifier for cellular telephone," Electronics Letters, vol. 30, No. 11 (May 26, 1994) pp. 906-907.

Öztürk, et al., "Advanced $Si_{1-x}Ge_x$ Source/Drain and Contact Technologies for Sub-70 nm CMOS," IEEE International Electron Device Meeting Technical Digest, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," IEEE International Electron Device Meeting Technical Digest (2003), pp. 497-500.

Öztürk, et al., "Selective Silicon-Gremanium Source/Drain Technology for Nanoscale CMOS," Mat. Res. Soc. Symp. Proc., vol. 717, (2002), pp. C4.1.1-C4.1.12.

Öztürk, et al., "Ultra-Shallow Source/Drain Junctions for Nanoscale CMOS Using Selective Silicon-Germanium Technology," Extended Abstracts of International Workshop on Junction Technology, (2001), pp. 77-82.

Palik et al., "Ellipsometric Study of the Etch-Stop Mechanism in Heavily Doped Silicon," Journal of the Electrochemical Society, vol. 132, No. 1 (Jan. 1985), pp. 135-141.

Palik et al., "Study of Bias-Dependent Etching of Si in Aqueous KOH," Journal of the Electrochemical Society, vol. 134, No. 2 (Feb. 1987), pp. 404-409.

Palik et al., "Study of the Etch-Stop Mechanism in Silicon," Journal of the Electrochemical Society, vol. 129, No. 9 (Sep. 1982), pp. 2051-2059.

Papananos, "Low Noise Amplifiers in MOS Technologies," and "Low Noise Tuned-LC Oscillator," Radio-Frequency Microelectronic Circuits for Telecommunication Applications (1999) pp. 115-117, 188-193.

Parker et al., "SiGe heterostructure CMOS circuits and applications," *Solid State Electronics*, vol. 43 (1999) pp. 1497-1506.

Petersen, "Silicon as a Mechanical Material," *Proceedings of the IEEE*, vol. 70, No. 5 (May 1982), pp. 420-457.

Powell et al., "New approach to the growth of low dislocation relaxed SiGe material," *Applied Physics Letters*, vol. 64, No. 14 (Apr. 4, 1994), pp. 1865-1858.

Rai-Choudhury et al., "Doping of Epitaxial Silicon," *Journal of Crystal Growth*, vol. 7 (1970), pp. 361-367.

Raley et al., "(100) Silicon Etch-Rate Dependence on Boron Concentration in Ethylenediamine-Pyrocatechol-Water Solutions," *Journal of the Electrochemical Society*, vol. 131, No. 1 (Jan. 1984), pp. 161-170.

Ransom et al., "Gate-Self-Aligned n-channel and p-channel Germanium MOSFET's," *IEEE Transactions on Electron Devices*, vol. 38, No. 12 (Dec. 1991) pp. 2695.

Reinking et al., "Febrication of high-mobility Ge p-channel MOSFETs on Si substrates," *Electronics Letters*, vol. 35, No. 6 (Mar. 18, 1999) pp. 503-504.

Rim et al., "Enhanced Hole Mobilities in Surface-channel Strained-Si p-MOSFETs"; *IEDM*, 1995, pp. 517-520.

Rim et al., "Fabrication and Analysis of Deep Submicron Strained-Si N-Mosfet's," *IEEE Transactions on Electron Devices*, vol. 47, No. 7, Jul. 2000, pp. 1406-1415.

Rim, "Application of Silicon-Based Heterostructures to Enhanced Mobility Metal-Oxide-Semiconductor Field-Effect Transistors", Ph.D. Thesis, Stanford University (1999) pp. 1-184.

Robbins et al., "A model for heterogeneous growth of $Si_{1-x}Ge_x$ films for hydrides," *Journal of Applied Physics*, vol. 69, No. 6 (Mar. 15, 1991) pp. 3729-3732.

Rosenblad et al., "Strain relaxation of graded SiGe buffers brown at very high rates," Materials Science and Engineering B, Elsevier Sequoia, Lausanne, CH, vol. 71, Nr. 1-3, p. 20-23, Feb. 2000.

Sadek et al., "Design of Si/SiGe Heterojunction Complementary Metal-Oxide Semiconductor Transistors," *IEEE Trans. Electron Devices* (Aug. 1996) pp. 1224-1232.

Sakaguchi et al., "ELTRAN® by Splitting Porous Si Layers," Proc. 195th Int. SOI Symposium, vol. 99-3, *Electrochemical Society* (1999) pp. 117-121.

Schäffler, "High-Mobility Si and Ge Structures," *Semiconductor Science and Technology*, vol. 12 (1997) pp. 1515-1549.

Seidel et al., "Anisotropic Etching of Crystalline Silicon in Alkaline Solutions," *Journal of the Electrochemical Society.*, vol. 137, No. 11 (Nov. 1990), pp. 3626-3632.

Senna et al., "Gallium Doping for Silicon Etch Stop in KOH," *Transducers '95/Eurosensors IX*, the 8th International Conference on Solid-State Sensors and Actuators and Eurosensors IX, Stockholm, Sweden, Jun. 25-29, 1995, pp. 194-195.

Shang et al., "The Development of an Anisotropic Si Etch Process Selective to $Ge_xSi_{1-x}$ Underlayers," *Journal of the Electrochemical Society.*, vol. 141, No. 2 (Feb. 1994), pp. 507-510.

Shimizu et al., "Local Mechanical-Stress Control (LMC): A New Technique for CMOS-Performance Enhancement," *IEEE International Electron Devices Meeting Technical Digest*, (2001), pp. 433-436.

Soderbarg, "Fabrication of BESOI-Materials Using Implanted Nitrogen as an Effective Etch Stop Barrier," *1989 IEEE SOS/SOI Technology Conference*, (Oct. 3-5, 1989), pp. 64.

Sugimoto et al., "A 2V, 500 MHz and 3V, 920 MHz Low-Power Current-Mode 0.6 μm CMOS VCO Circuit", *IEICE Trans. Electron.*, vol. E82-C, No. 7 (Jul. 1999) pp. 1327-1329.

Sundaram et al., "Electromechanical etching of Silicon by Hydrazine," *Journal of the Electromechanical Society*, vol. 140, No. 6 (Jun. 1993), pp. 1592-1597.

Sze, " Physics of Semiconductor Devices," (1991).

Takagi et al., "On the University of Inversion Layer Mobility in Si MOSFET's Part I-Effects of Substrate Impurity Concentration," *IEEE Transactions on Electron Devices*, vol. 41, No. 12 (Dec. 1994), pp. 2357-2362.

Tement et al., "Metal Gate Strained Silicon MOSFETs for Microwave Integrated Circuits", *IEEE* (Oct. 2000) pp. 38-43.

Thompson et al., "A 90 nm Logic Technology Featuring 50nm Strained-Silicon Channel Transistors, 7 layers of Cu *Interconnects*, Low k ILD, and lum² SRAM Cell," *IEEE International Electron Devices Meeting Technical Digest*, (2002), pp. 61-64.

Thompson et al., "A Logic Nanotechnology Featuring Strained-Silicon," *IEEE Electron Device Letters*, vol. 25, No. 4 (Apr. 2004), pp. 191-193.

Ting et al., "Monolithic Integration of III-V Materials and Devices on Silicon," Part of the0 SPIE Conference on Silicon-Based Optoelectronics, San Jose, CA, (Jan. 1999), pp. 19-28.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Tong, et al., "Semiconductor Wafer Bonding: Science and Technology," *Wiley-Interscience*, (1999), pp. 33 and 70-71.

Tsang et al., "Measurements of alloy composition and strain in thin $Ge_xSi_{1-x}$ layers," *J. Appl. Phys.*, vol. 75 No. 12 (Jun. 15, 1994) pp. 8098-8108.

Tweet et al., "Factors determining the composition of strained GeSi layers grown with disilane and germane," *Applied Physics Letters*, vol. 65, No. 20 (Nov. 14, 1994) pp. 2579-2581.

Uchino, et al., "A Raised Source/Drain Technology Using In-situ P-doped SiGe and B-doped Si for 0.1-μm CMOS ULSIs," *IEEE International Electron Device Meeting Technical Digest*, (1997), pp. 479-482.

Usami et al., "Spectroscopic study of Si-based quantum wells with neighboring confinement structure," *Semicon. Sci. Technol.* (1997) (abstract).

Vol'fson et al., "Fundamental Absorption Edge of Silicon Heavily Doped with Donor or Acceptor Impurities," *Soviet Physics Semiconductors*, vol. 1, No. 3 (Sep. 1967), pp. 327-332.

Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994) pp. 100-102.

Welser et al., "Evidence of Real-Space Hot-Electron Transfer in High Mobility, Strained-Si Multilayer MOSFETs," *IEEE IDEM Technical Digest* (1993) pp. 545-548.

Welser et al., "NMOS and PMOS Transistors Fabricated in Strained Silicon/Relaxed Silicon-Germanium Structures," *IEEE IDEM Technical Digest* (1992) pp. 1000-1002.

Welser, "The Application of Strained Silicon/Relaxed Silicon Germanium Heterostructures to Metal-Oxide-Semiconductor Field-Effect Transistors," Ph.D. Thesis, Stanford University (1994) pp. 1-205.

Wolf et al., "Silicon Processing for the VLSI Era," vol. 1 *Process Technology* (1986) pp. 384-386.

Wu, "Novel Etch-Stop Materials for Silicon Micromachining," Thesis Submitted to the Massachusetts Institute of Technology Department of Materials Science and Engineering on May 9, 1997, pp. 1-62.

Xie et al., "Semiconductor Surface Roughness: Dependence on Sign and Magnitude of Bulk Strain," *The Physical Review Letters*, vol. 73, No. 22 (Nov. 28, 1994) pp. 3006-3009.

Xie et al., "Very high mobility two-dimensional hole gas in $Si/Ge_xSi_{1-x}/Ge$ structures grown by molecular beam epitaxy," *Appl. Phys. Lett.*, vol. 63, No. 16 (Oct. 18, 1993) pp. 2263-2264.

Xie, "SiGe Field effect transistors," *Materials Science and Engineering*, vol. 25 (1999) pp. 89-121.

Yamagata et al., "Bonding, Splitting and Thinning by Porous Si in ELTRAN®; SOI-Epi Wafer™," *Mat. Res. Soc. Symp. Proc.*, vol. 681E (2001) pp. 18.2.1-18.2.10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000) pp. 161-163.

Yi et al., "$Si_{1-x}Ge_x$/Si Multiple Quantum Well Wires Fabricated Using Selective Etching," *Materials Research Society Symposium Proceedings*, vol. 379 (1995), pp. 91-96.

Zhang et al., "Demonstration of a GaAs-Based Complaint Substrate Using Wafer Bonding and Substrate Removal Techniques," Electronic Materials and Processing Research Laboratory, Department of Electrical Engineering, University Park, PA 16802 (1998) pp. 25-28.

* cited by examiner

METHODS FOR FABRICATING STRAINED LAYERS ON SEMICONDUCTOR SUBSTRATES

CROSS-REFERENCE TO RELATED APPLICATION

This application is a continuation of U.S. application Ser. No. 10/389,003, filed on Mar. 14, 2003 now U.S. Pat. No. 7,060,632, which claims priority to and the benefit of provisional U.S. patent application Ser. No. 60/364,733, filed Mar. 14, 2002. The disclosures of both of these applications are incorporated herein by reference in their entirety.

FIELD OF THE INVENTION

The present invention relates generally to semiconductor fabrication methods and, more specifically, to methods for fabricating semiconductor structures having strained layers and controlled impurity diffusion gradients.

BACKGROUND OF THE INVENTION

The increasing operating speeds and computing power of microelectronic devices have given rise to the need for an increase in the complexity and functionality of the semiconductor substrates that are used as the starting substrate in these microelectronic devices. Historically, to maintain low fabrication cost, these semiconductors were built using silicon (Si) substrates. Nevertheless, with increasing speed and functionality requirements, Si substrates become limiting and designers need to use alternative materials that provide improved performance.

Potential alternatives include substrates made from materials such as germanium (Ge), gallium arsenide (GaAs), indium phosphide (InP), or gallium nitride (GaN). These alternate materials permit the development of a substrate suitable for a wider range of device types, functionalities, and speed. For example, new technological developments provide the ability to form heterostructures using silicon germanium (SiGe) to further speed up devices by changing the atomic structure of Si to increase electron mobility. These substrates are called strained Si substrates.

A strained Si substrate is generally formed by a first epitaxial growth of a relaxed SiGe layer on bulk Si, and then a second epitaxial growth of a thin (less than about 500 Angstroms) Si layer on the relaxed SiGe layer. Because the lattice constant of relaxed SiGe is different from Si, the thin Si layer becomes "strained," resulting in enhanced mobilities (and hence improved device speeds) over bulk Si. The percentage of Ge in SiGe, and the method of deposition can have a dramatic effect on the characteristics of the strained Si layer. U.S. Pat. No. 5,442,205, "Semiconductor Heterostructure Devices with Strained Semiconductor Layers," incorporated herein by reference, demonstrates one such method of producing a strained Si device structure.

A method of epitaxially growing a relaxed SiGe layer on bulk Si is discussed in PCT application WO 01/22482, "Method of Producing Relaxed Silicon Germanium Layers," incorporated herein by reference. The method includes providing a monocrystalline Si substrate, and then epitaxially growing a graded $Si_{1-x}Ge_x$ layer with increasing Ge concentration at a gradient of less than 25% Ge per micron to a final composition in the range of $0.1 \leq x \leq 1$, using a source gas of $Ge_xH_yCl_z$ for the Ge component, on the Si substrate at a temperature in excess of 850° C., and then epitaxially growing a semiconductor material on the graded layer. (The terms "SiGe" and "$Si_{1-x}Ge_x$" are used interchangeably to refer to silicon-germanium alloys.)

Another method of epitaxially growing a relaxed SiGe layer on bulk Si is discussed in a paper entitled, "Low Energy plasma enhanced chemical vapor deposition," by M. Kummer et. al. (Mat. Sci. & Eng. B89, 2002, pp. 288-95), incorporated herein by reference, in which a method of low-energy plasma-enhanced chemical vapor deposition (LEPECVD) is shown, which allows the formation of a SiGe layer on bulk Si at high growth rates (0.6 micron per minute) and low temperatures (500-750° C.).

SiGe graded layers with low threading dislocation densities (i.e., two-dimensional defects in a single crystal material) are usually thick layers (greater than 1000 Angstroms and often greater than one micron). Consequently, the industry is moving toward chemical vapor deposition (CVD) techniques that allow high growth rates. Nevertheless, to grow a thin (less than 500 Angstroms thick), epitaxial strained Si layer uniformly on the SiGe, a high growth rate process is not optimal. To maintain a high-quality strained Si layer without defects, a low-growth rate, low-temperature (LT) CVD process is preferred. In other words, for developing strained Si substrates, the optimal epitaxial growth process of the first thick SiGe layer on bulk Si is different from the optimal epitaxial growth process of the second thin Si layer.

To grow a high-quality, thin, epitaxial strained Si layer on a graded SiGe layer, the SiGe layer is, ideally, planarized to reduce the surface roughness in the final strained Si substrate. Current methods of chemical mechanical polishing (CMP) are typically used to improve the planarity of surfaces in semiconductor fabrication processes. U.S. Pat. No. 6,107,653, "Controlling Threading Dislocations in Ge on Si Using Graded GeSi Layers and Planarization," incorporated herein by reference, describes how planarization can be used to improve the quality of SiGe graded layers.

Integrating the development process of strained Si substrates with existing Si-based tools minimizes the re-tooling of fabrication plants. Nevertheless, existing Si fabrication tools generally do not support the process control differences required for the epitaxial growth of the first thick SiGe layer and the second thin Si layer sequentially in the same CVD step. Additionally, a planarization step may be inserted between the thick SiGe layer deposition and the thin Si layer deposition to ensure that the resulting substrate has good surface morphology.

One challenge to the manufacturability of semiconductor devices that include strained layers is that one or more high temperature processing steps are typically employed after the addition of the strained material. This can cause intermixing of the strained layer and adjacent material. This intermixing is generally referred to as interdiffusion, and it can be described by well-known diffusion theory (e.g., Fick's laws). One example of interdiffusion is found in a field effect transistor ("FET") where a strained layer is used as the channel. In this example, one or more impurities (e.g., dopants) are implanted after addition of the strained layer. If implantation is followed by a moderately high temperature step (e.g., a drive-in or anneal step), there can be rampant interdiffusion of the channel by the implant impurity due to the presence of implant damage and excess point defects in the strained layer. A result is that the impurity is present in the strained layer. Stated differently, the impurity profile (i.e., a gradient describing the impurity concentration as a function of location in the overall semiconductor or device) has a non-zero value in the strained layer. Presence of one or more impurities in the strained layer can, at certain concentrations, degrade overall device performance.

From the foregoing, it is apparent that there is still a need for a way to produce semiconductor structures by rapidly growing a thick SiGe layer followed by growing a thin, high-quality, strained Si layer. Further, it is desirable to accomplish this with a process tool that integrates the fabrication steps and allows for planarizing the SiGe layer. It is advantageous for the resulting structures to exhibit minimal incursion of one or more impurity species into the strained layer.

SUMMARY OF THE INVENTION

The present invention provides methods for fabricating semiconductor structures that include several growth steps, each step being optimized for the particular semiconductor layer to be grown. For processing efficiency, the fabrication steps may be integrated into a single tool or a minimum number of tools. One or more strained material layers that are grown are relatively free of interdiffused impurities. Consequently, semiconductor devices built using the structures described herein do not exhibit the degraded performance that results from the presence of such impurities in the strained layers.

The invention features a method for fabricating a semiconductor structure on a substrate. The method includes the step of exposing the substrate to a first gas mixture at a temperature greater than about 500° C. This results in rapid growth of one or more layers of SiGe having a thickness greater than about 1000 Angstroms. Following this, the SiGe is planarized and the substrate is exposed to a second gas mixture at a temperature less than or equal to about 750° C. This results in the growth of one or more strained layers having a thickness less than about 500 Angstroms. Both the first and second gas mixtures typically include Si, or Ge, or both.

In certain embodiments, the semiconductor substrate can include Si, SiGe, or any combination of these materials. It can also be multi-layered. In this latter case, the layers can include relaxed SiGe disposed on compositionally graded SiGe. The layers can also include relaxed SiGe disposed on Si. One or more buried insulating layers may be included as well.

In other embodiments, the grown SiGe layer(s) may be substantially relaxed or compositionally graded. Further, the strained layer can include Si, Ge, SiGe, or any combination of these materials. At least about fifty Angstroms of the furthest part of the strained layer defines a distal zone where the concentration of impurities is substantially equal to zero. Some embodiments include a subsequent SiGe layer deposited on the strained layer.

An alternative embodiment includes fabricating a semiconductor structure on a substrate having one or more preexisting material layers with a thickness greater than about 200 Angstroms. This method involves exposing the substrate to a gas mixture that includes Si, or Ge, or both, at a temperature less than or equal to about 750° C. This results in the growth of one or more strained layers having a thickness less than about 500 Angstroms. In some embodiments, the preexisting material layers may include SiGe, an insulating layer, or both.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings, in which.

DETAILED DESCRIPTION

Figure 1:
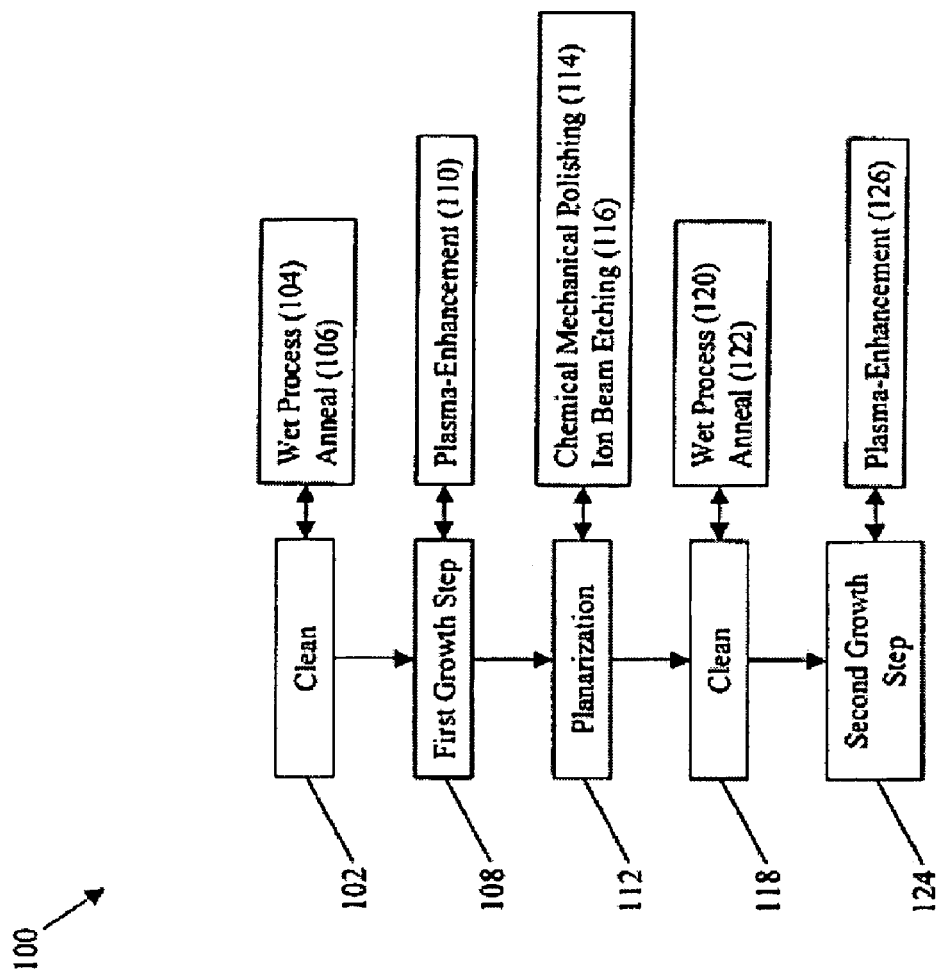
FIG. 1 is a flowchart depicting the steps of fabricating a semiconductor structure in accordance with an embodiment of the invention.

As shown in the drawings for the purposes of illustration, the invention may be embodied in a fabrication method for a semiconductor structure or device, such as, for example, a FET, having specific structural features. A semiconductor structure fabricated according to the invention includes multiple layers grown under conditions optimized for each layer. These layers can be Si or SiGe, and may be strained or relaxed. Further, the strained material layers are relatively free of interdiffused impurities. Stated differently, these strained material layers are characterized by at least one diffusion impurity gradient that has a value that is substantially equal to zero in a particular area of the strained layer. Consequently, the semiconductor structure does not exhibit the degraded performance that results from the presence of such impurities in certain parts of the strained layers.

In brief overview, FIG. 1 depicts a method 100 for fabricating a semiconductor structure on a substrate in accordance with an embodiment of the invention. The substrate may be Si, SiGe, or other compounds such as, for example, GaAs or InP. The substrate may also include multiple layers, typically of different materials. For example, the multiple layers can include relaxed SiGe disposed on compositionally graded SiGe, as well as relaxed SiGe disposed on Si. The multiple layers may also include a buried insulating layer, such as $SiO_2$ or $Si_3N_4$. The buried insulating layer may also be doped.

This method shown in FIG. 1 includes a first growth step 108 where the substrate is exposed to a gas mixture at a temperature greater than about 500° C. In one embodiment, the temperature can be greater than about 850° C. In other embodiments this exposure occurs at a pressure less than or equal to about 760 Torr (absolute). The gas mixture typically includes Si, or Ge, or both. Some example gas mixtures are $SiH_4$—$GeH_4$, $SiH_2Cl_2$—$GeCl_4$, $SiH_2Cl_2$—$GeH_4$, $SiHCl_3$—$GeCl_4$, and $SiHCl_3$—$GeH_4$.

Figure 2:
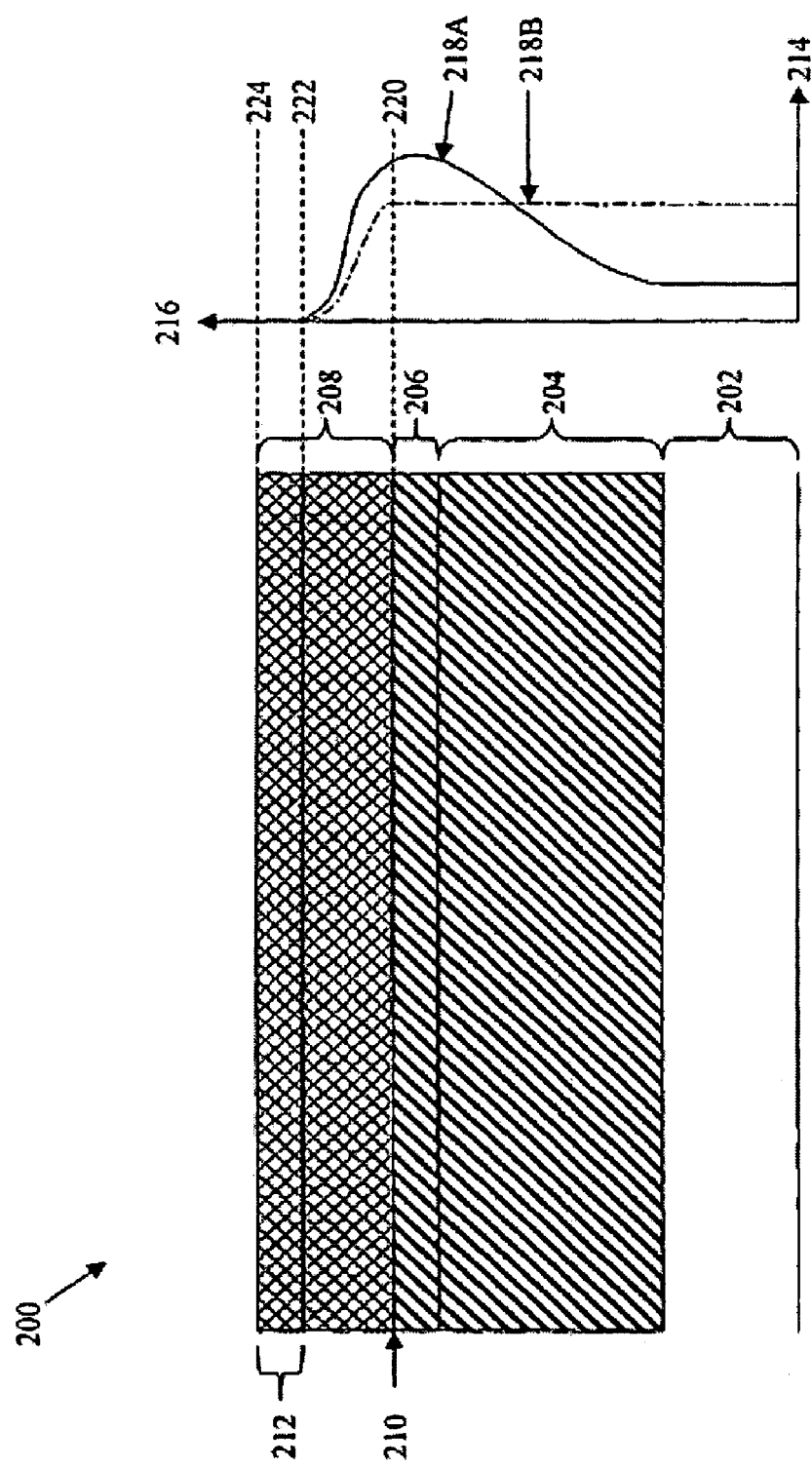
FIG. 2 is a schematic (unscaled) cross-sectional view that depicts a semiconductor structure in accordance with an embodiment of the invention.

Using one or more of these gas mixtures, one or more layers of SiGe 204 are grown on a substrate 202, as depicted in FIG. 2, which illustrates an example semiconductor structure 200. In one embodiment, the growth rate of the SiGe can be greater than about 0.2 micron per minute, and the resulting thickness can be greater than about 1000 Angstroms or even greater than about one micron. Further, the SiGe can be substantially relaxed. It can also be compositionally graded (e.g., ten percent Ge per micron of thickness). Some embodiments include multiple SiGe layers where one or more of these layers may have a substantially constant Ge content. The layers grown during the first growth step 108 may be "deposited" by chemical vapor deposition ("CVD").

Increasing the temperature of the first growth step 108 so it is greater than about 850° C. can increase the growth rate to about 0.5 micron per minute. Nevertheless, a high growth rate may also be achieved at a lower temperature (e.g., between about 500° C. and about 750° C.) by including a plasma enhancement step 110. With the plasma enhancement step 110, the growth rate of the first growth step 108 typically increases to about 0.6 micron per minute. The plasma enhancement step 110 may include the use of low energy plasma.

Optionally, in one embodiment, cleaning step 102 is performed before the first growth step 108. In cleaning step 102 the substrate 202 is typically subjected to a wet process 104. Examples of the wet process 104 include the RCA clean, the IMEC clean, the Ohmi clean, and the DDC clean. Further, the cleaning step may be mechanically augmented (e.g., using ultrasonic or megasonic excitation). The cleaning step 102 can also include a $CO_2$-based process (e.g., cryogenic). Dry (e.g., plasma-enhanced) cleaning processes may be used as well. In some embodiments, the cleaning step 102 can include an anneal step 106 where the substrate 202 is placed in, for example, a hydrogen ambient (e.g., at 1150° C.) for a certain amount of time (e.g., ninety seconds). In any case, the cleaning step 102 removes contamination and other material detrimental to the semiconductor structure 200.

A planarization step 112 follows the first growth step 108. In the planarization step 112 the surface of the SiGe layer 204 is subjected to a chemical mechanical polishing step 114, or an ion beam etching step 116, or both. A result is that, after the planarization step 112, the surface of the SiGe layer 204 exhibits a surface roughness that is typically less than two Angstroms. This is an improvement over the typical twenty to fifty Angstrom surface roughness present in the as-grown SiGe layer 204.

Subsequent to the planarization step 112, some embodiments include another cleaning step 118. Cleaning step 118 can also include a wet process 120, or a dry process, or both, examples of which are discussed above. The cleaning step 118 can also include an anneal step 122, similar to that described above.

In one embodiment a SiGe regrowth layer 206 is disposed (e.g., deposited) on the substrate 202 after the planarization step 112. The SiGe regrowth layer 206 typically has a thickness greater than about 500 Angstroms although, in some embodiments, the thickness may be greater than about 5000 Angstroms or even greater then about one micron. In another embodiment, for reasons of, for example, economy, the thickness is minimized (e.g., less than about 500 Angstroms). Further, in one embodiment, the Ge concentration in the SiGe regrowth layer 206 is substantially equal to that in the SiGe layer 204.

Irrespective of the presence of the SiGe regrowth layer 206, a second growth step 124 is next performed where the substrate 202 is exposed to a gas mixture at a temperature less than or equal to about 750° C. In some embodiments this exposure occurs at a pressure less than or equal to about 760 Torr (absolute). The gas mixture typically includes Si, or Ge, or both. Some example gas mixtures are $SiH_4$—$GeH_4$, $SiH_2Cl_2$—$GeCl_4$, $SiH_2Cl_2$—$GeH_4$, $SiHCl_3$—$GeCl_4$, and $SiHCl_3$—$GeH_4$. Nevertheless, in one embodiment, the gas mixture used in the second growth step 124 has a lower decomposition temperature than the gas mixture used in the first growth step 108.

Using one or more of these gas mixtures, one or more strained layers 208, typically having a thickness less than about 500 Angstroms, are grown on the substrate 202. In some embodiments the growth rate of the strained layers 208 is less than the growth rate of the SiGe layer 204 in the first growth step 108. The strained layers 208 grown during the second growth step 124 may be "deposited" by chemical vapor deposition ("CVD"). Due, at least in part, to the low surface roughness achieved by the planarization step 112, the surface roughness of the one or more strained layers 208 is typically less than about five Angstroms. Controlling the thickness of the strained layers 208, as well as the temperature at which they are grown, also contributes to their final surface roughness. In one embodiment, a plasma-enhancement step 126 may be included in the second growth step 124. This typically results in increased growth rates at reduced temperatures. The plasma-enhancement step 126 may include the use of low energy plasma.

In further embodiments, the strained layer 208 includes one or more of strained Si, strained Ge, or strained SiGe. The strained layer 208 may also be tensilely or compressively strained. For example, in one embodiment, the strained layer 208 includes compressively strained Ge. The "strain" in the strained layer 208 may be induced by lattice mismatch with respect to an adjacent layer, as described above, or mechanically. For example, strain may be induced by the deposition of overlayers, such as $Si_3N_4$. Another way is to create underlying voids by, for example, implantation of one or more gases followed by annealing. Both of these approaches induce strain in the layer underlying the strained layer 208, which causes strain in the strained layer 208.

The substrate 202, SiGe layers 204, 206, strained layer 208, and an interface 210 between the SiGe layers 204, 206 and strained layer 208, are characterized, at least in part, by an impurity gradient 218A, 218B (collectively, 218). The impurity gradient 218 describes the concentration of the impurity species as a function of location across the substrate 202, the strained layer 208, layers near or adjacent to the strained layer 208 (e.g., the SiGe layers 204, 206) and the interface 210. The impurity gradient 218 may be determined by solving Fick's differential equations, which describe the transport of matter:

$$J = -D\frac{\partial N}{\partial x} \qquad \text{(Equation 1)}$$

$$\frac{\partial N}{\partial t} = D\frac{\partial^2 N}{\partial x^2} \qquad \text{(Equation 2)}$$

In equations (1) and (2), "J" is the impurity flux, "D" is the diffusion coefficient, and "N" is the impurity concentration. Equation (1) describes the rate of the permeation of the diffusing species through unit cross sectional area of the medium under conditions of steady state flow. Equation (2) specifies the rate of accumulation of the diffusing species at different points in the medium as a function of time, and applies to transient processes. In the general case, equations (1) and (2) are vector-tensor relationships that describe these phenomena in three dimensions. In some cases, equations (1) and (2) may be simplified to one dimension.

The steady state solution to equation (1), which is not detailed herein, is a function of the Gaussian error function:

$$erf(y) = \frac{2}{\sqrt{\pi}} \int_0^y e^{-z^2} dz \qquad \text{(Equation 3)}$$

An example solution is shown in FIG. 2 as the impurity gradient 218. Axis 214 represents the impurity concentration, typically in units of cm$^{-3}$. Axis 216 corresponds to the location in the semiconductor structure 200. Axis 216 is aligned with the semiconductor structure 200 to illustrate a typical impurity profile, meaning that the impurity concentration at any point in the semiconductor structure 200 can be ascertained as a function of location. Except as described below, the depicted shape of the impurity gradient 218 is not intended to be limiting. For example, impurity gradient 218A may describe a profile of a p-type (e.g., boron) or n-type (e.g., phosphorous or arsenic) dopant introduced in the substrate 202 or elsewhere in the semiconductor structure 200. On the other hand, impurity gradient 218B may, for example, describe a substantially constant concentration of Ge, or Si, or both, in the substrate 102 that takes on a desired value (e.g., a reduced value) in the strained layer 208. Stated differently, the impurity gradient 218 may describe the concentration of any species in the substrate 202, including the substrate species itself, at any point in the semiconductor structure 200.

Boundary 220 represents the interface 210 between the SiGe regrowth layer 206 and the strained layer 208. (In embodiments lacking the SiGe regrowth layer 206, boundary 220 represents the interface between the SiGe layer 204 and the strained layer 208.) Boundary 222 depicts the start of a distal zone 212 of the strained layer 104. The distal zone 212 is located away from the interface 210.

Boundary 224 corresponds to the edge of the strained layer 208. Of note are the locations where the boundaries 220, 222, 224 intersect the axis 216 and the impurity gradient 218. In particular, the impurity gradient 218 has a value substantially equal to zero in the distal zone 212. This is depicted by the impurity gradient 218 approaching the axis 216 at the boundary 222, and remaining there, or at zero, or at another value substantially equal to zero, between the boundary 222 and the boundary 224. Of course, the impurity gradient 218 can also have a value substantially equal to zero before reaching the boundary 222. In any case, one embodiment of the invention features a distal zone 212 that includes at least about fifty Angstroms of the furthest part of the strained layer 208. That is, the distal zone 212 is at least about fifty Angstroms thick.

Figure 3:
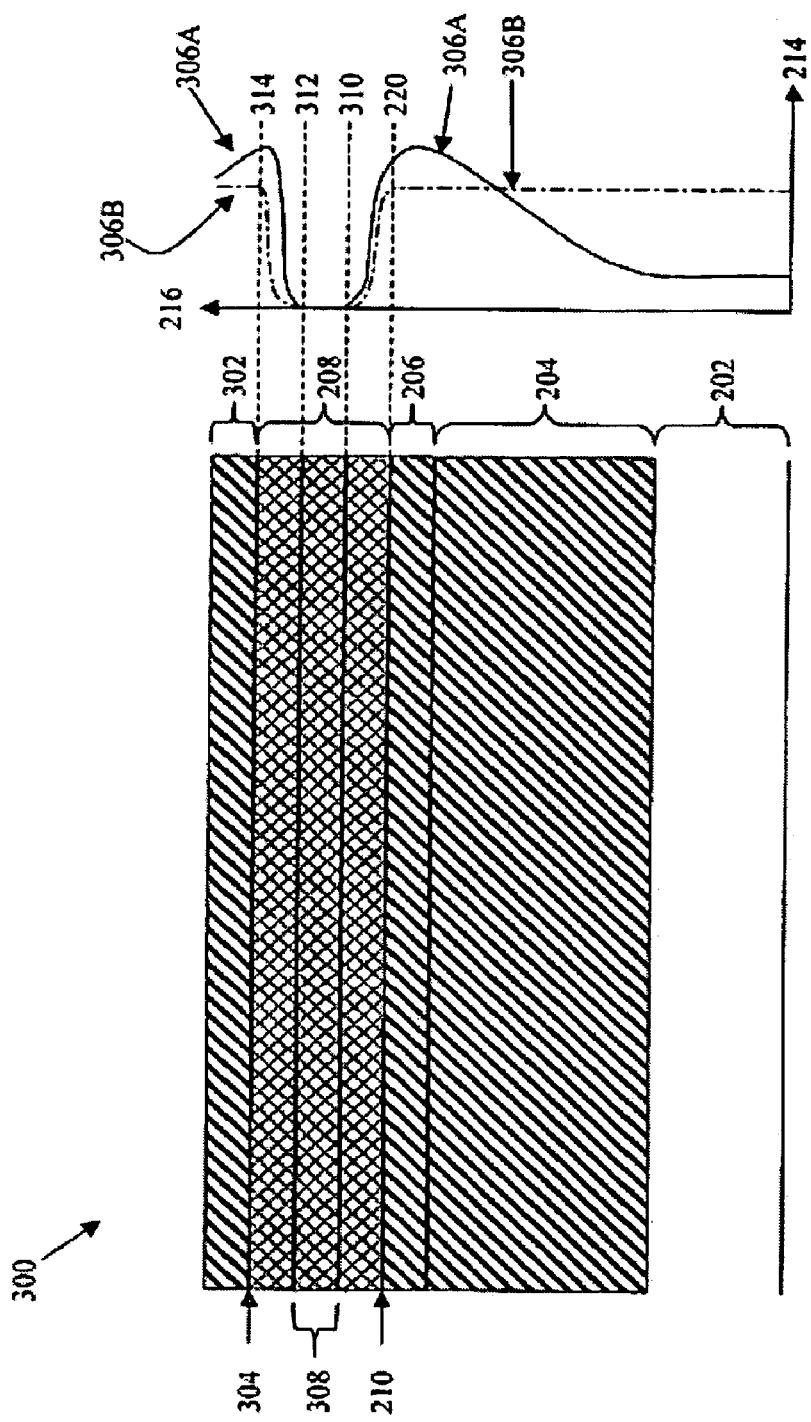
FIG. 3 is a schematic (unscaled) cross-sectional view that depicts another semiconductor structure in accordance with an embodiment of the invention.

FIG. 3 depicts another embodiment of a semiconductor structure 300 where the second growth step 124 is followed by a step that disposes (e.g., deposits by CVD) one or more subsequent SiGe layers 302 on the strained layers 208. One or more of the subsequent SiGe layers 302 may be relaxed. An interface 304 is between the strained layers 208 and the subsequent SiGe layers 302.

In a further embodiment, an impurity gradient 306A, 306B (collectively, 306) describes the impurity concentration at any point in the semiconductor structure 300, including in the subsequent SiGe layers 302. The illustrative example shown in FIG. 3 demonstrates that the impurity gradient 306 has a value substantially equal to zero in a zone 308 within the strained layers 208, but a non-zero value in other areas of the semiconductor structure 300, including in the subsequent SiGe layers 302. Boundaries 310, 312 define the limits of the zone 308, and a boundary 314 corresponds to the interface 304. Stated differently, the impurity gradient 306 has a value substantially equal to zero between the boundaries 310, 312. This is depicted by the impurity gradient 306 approaching the axis 216 at the boundaries 310, 312 and remaining there, or at zero, or at another value substantially equal to zero, between the boundaries 310, 312. Of course, the impurity gradient 306 can also have a value substantially equal to zero before reaching the boundary 310 or the boundary 312. Between the boundaries 312, 314, and outside of the boundary 314, the impurity gradient 306 may have any value (e.g., zero or non-zero).

The depicted shape of the impurity gradient 306 is not intended to be limiting. As discussed above regarding the impurity gradient 218, the impurity gradient 306 may describe a profile of a dopant introduced in the semiconductor structure 300. The impurity gradient 306 may also describe the concentration of any species in the substrate 202, including the substrate species itself, at any point in the semiconductor structure 300.

In one embodiment, a distal zone away from the interface 210 between the strained layers 208 and an adjacent layer (e.g., the SiGe regrowth layer 206 or the SiGe layer 204) begins at a point that coincides generally with the boundary 310. Further, a distal zone away from the interface 304 between the strained layers 208 and an adjacent layer (e.g., the subsequent SiGe layers 302) begins at a point that coincides generally with the boundary 312. The aggregation of these two distal zones forms the zone 308 where the impurity gradient 306 has a value substantially equal to zero. One embodiment features distal zones that include at least about fifty Angstroms of the strained layer. In the aggregation of the distal zones depicted in FIG. 3, this results in the zone 308 being at least about fifty Angstroms thick.

In another embodiment, a growth step may be performed on a semiconductor substrate that has one or more preexisting material layers thereon. The thickness of these preexisting material layers is, for example, greater than about 200 Angstroms, either individually or in the aggregate. In this embodiment the substrate, which may include any of the substrate materials discussed above, is exposed to a gas mixture that contains Si, or Ge, or both, (see, e.g., the example gas mixtures described above) at a temperature less than or equal to about 750° C. This generally results in the growth (by, e.g., CVD) of a strained layer having a thickness less than about 500 Angstroms. The typical growth rate of the strained layer is about 0.2 micron per minute, or less. In one embodiment, the growth step includes plasma-enhancement. This typically results in increased growth rates at reduced temperatures. The plasma-enhancement may include the use of low energy plasma.

In a related embodiment, the one or more preexisting material layers include SiGe, which may be substantially relaxed. These layers may also include one or more insulating layers (e.g., SiO$_2$ or Si$_3$N$_4$, doped or undoped). Further embodiments include the step of planarizing one or more of the preexisting material layers before subjecting the semiconductor substrate to the growth step. As discussed above, this planarization may be accomplished by, for example, chemical mechanical polishing, or ion beam etching, or both. Optionally, the one or more preexisting material layers may be cleaned (e.g., by using a wet process, dry process, or anneal, all as described above) before or after the growth step.

Efficiency and yield are generally improved when semiconductor fabrication is accomplished using a minimum number of process tools. This allows semiconductor substrates (e.g., wafers) to move between different processing environments while limiting their handling and exposure to unclean surroundings. This is a basis of the "cluster tool" concept. Typically, a conventional controller manages the various process steps occurring within a cluster tool. The controller may be, for example, a computer or other programmable apparatus. In general, the controller directs the operation of one or more aspects of the tool using, for example, standard or custom software. An equipment operator, in turn, interacts with the controller.

Of course, it may be difficult or impossible to perform certain processing steps within a single or limited (e.g., minimum) number of process tools. Further, wafers must be loaded and unloaded from the tool(s) at the beginning and end of fabrication. Accordingly, the tool(s) generally include a load lock station where an operator can access the wafers and, for example, move them in or out of the tool(s).

In one embodiment, one or more of the steps encompassed by the fabrication method 100 occur in a single process tool, or at least in a limited number of process tools. For example, the first growth step 108 and the second growth step 124 can be performed in separate CVD chambers in a single process tool. Alternatively, and notwithstanding their different process parameters (e.g., gas mixture, temperature, etc.), these steps may be performed in a single CVD chamber in a single process tool. Of course, these steps may also be performed in separate (e.g., dedicated) process tools.

In a further embodiment, one or more of the cleaning steps 102, 118, the first growth step 108, and the second growth step 124 may be performed in a single process tool. For example, one or more of the cleaning steps 102, 118 may be performed in one chamber, and the growth steps 108, 124 may be performed in one or more other chambers. In any event, integrating one or more of the cleaning steps 102, 118 into the same process tool as that used for the growth steps 108, 124 typically occurs if the cleaning steps 102, 118 used the corresponding anneal processes 106, 122, or a dry process, as the cleaning mechanism. Clearly, one or more of the cleaning steps 102, 118 may also be performed in one or more process tools that are separate from that used for the growth steps 108, 124.

Semiconductor structures fabricated in accordance with embodiments of the invention typically have a threading dislocation density less than $10^6$ cm$^{-2}$ and, in some instances, less than $10^5$ cm$^{-2}$. Further, particle density is typically less than 0.3 cm$^{-2}$. The relaxed $Si_{1-x}Ge_x$ layers produced in accordance with an embodiment of invention typically have localized light-scattering defect levels, which are related to particle size (diameter), as described in the following table:

| Approximate Particle Size (Diameter) [microns] | Approximate Defect Level [cm$^{-2}$] |
| --- | --- |
| Greater than 0.13 | 0.3 |
| Greater than 0.16 | 0.2 |
| Greater than 0.2 | 0.1 |
| Greater than 1 | 0.03 |

Further process enhancements suggest that localized light-scattering defect levels will be reduced to 0.09 cm$^{-2}$ and 0.05 cm$^{-2}$ for particle sizes (diameters) greater than about 0.09 microns and 0.12 microns, respectively.

From the foregoing, it will be appreciated that the methods of fabricating semiconductor structures provided by the invention afford a simple and effective way to produce multi-layered, strained material configurations under conditions optimized for each layer. Inefficiencies and yield degradation due to excessive wafer handling and transport between several dedicated process tools are largely eliminated.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A method for fabricating a semiconductor structure on a substrate, the substrate having at least one preexisting material layer with a thickness greater than about 200 Angstroms, the method comprising:
   planarizing the at least one preexisting material layer;
   cleaning the substrate; and
   thereafter, exposing the substrate to a gas mixture comprising at least one of Si and Ge at a temperature less than or equal to about 750° C., thereby disposing on the substrate at a growth rate less than about 0.2 micron per minute at least one strained layer having a thickness less than about 500 Angstroms.

2. The method of claim 1 wherein the at least one preexisting material layer comprises SiGe.

3. The method of claim 2 wherein the SiGe is substantially relaxed.

4. The method of claim 2 wherein the at least one preexisting material layer comprises at least one insulating layer.

5. The method of claim 1 wherein the step of exposing the substrate to a gas mixture comprises plasma enhancement.

6. The method of claim 1 wherein the at least one strained layer and at least one adjacent layer define at least one interface therebetween, the at least one strained layer has at least one distal zone away from the at least one interface, and wherein the substrate, the at least one adjacent layer, the at least one interface, and the at least one strained layer are characterized at least in part by an impurity gradient having a value substantially equal to zero in the at least one distal zone.

7. The method of claim 6 wherein the at least one adjacent layer comprises at least one layer of SiGe.

8. The method of claim 6 wherein the at least one distal zone comprises at least about fifty Angstroms of the at least one strained layer.

9. The method of claim 6 wherein the impurity gradient describes at least the concentration of Si.

10. The method of claim 6 wherein the impurity gradient describes at least the concentration of Ge.

11. The method of claim 1 wherein the step of cleaning the substrate comprises at least one of wet cleaning, dry cleaning, and annealing.

12. The method of claim 1 wherein the step of cleaning the substrate and the step of exposing the substrate to the gas mixture are performed in a common process tool.

13. The method of claim 12 wherein the process tool comprises at least a first chamber and a second chamber, the step of cleaning the substrate is performed in the first chamber, and the step of exposing the substrate to the gas mixture is performed in the second chamber.

14. The method of claim 12 wherein the process tool comprises a chamber and the step of cleaning the substrate and the step of exposing the substrate to the gas mixture are performed in the chamber.

15. The method of claim 1 wherein the strained layer has a threading dislocation density less than $10^5$ cm$^{-2}$.

16. The method of claim 1 wherein the strained layer has a particle density less than 0.3 cm$^{-2}$.

17. The method of claim 4 wherein the at least one insulating layer comprises at least one of silicon dioxide and silicon nitride.

18. The method of claim 1 wherein the step of planarizing comprises at least one of chemical mechanical polishing and ion beam etching.

* * * * *